(12) United States Patent
Magdassi et al.

(10) Patent No.: US 7,963,646 B2
(45) Date of Patent: Jun. 21, 2011

(54) INK-JET INKS CONTAINING METAL NANOPARTICLES

(75) Inventors: Shiomo Magdassi, Jerusalem (IL); Alexander Kamyshny, Jerusalem (IL); Yelena Vinetsky, Jerusalem (IL); Amal Bassa, West Bank (IL); Raim Mokh Abo, Baka El Kharbia (IL)

(73) Assignee: Yissum Research Development Company of the Hebrew University of Jerusalem Israell Company, Givat Ram Jerusalem (IL)

( * ) Notice: Subject to any disclaimer, the term of this patent is extended or adjusted under 35 U.S.C. 154(b) by 777 days.

(21) Appl. No.: 10/494,309

(22) PCT Filed: Oct. 28, 2002

(86) PCT No.: PCT/IL02/00859
§ 371 (c)(1),
(2), (4) Date: Dec. 1, 2004

(87) PCT Pub. No.: WO03/038002
PCT Pub. Date: May 8, 2003

(65) Prior Publication Data
US 2005/0078158 A1   Apr. 14, 2005

(51) Int. Cl.
B05D 1/32 (2006.01)
B05D 1/36 (2006.01)
B05D 1/38 (2006.01)
B05D 3/02 (2006.01)
B41J 2/01 (2006.01)
B41J 2/17 (2006.01)
G01D 11/00 (2006.01)

(52) U.S. Cl. .......... 347/100; 106/31.01; 106/31.13; 106/31.6; 106/31.65; 106/31.77; 106/31.9; 106/31.92; 347/1; 347/84; 347/95; 347/96; 427/466; 427/372.2; 427/385.5; 427/470; 428/32.1; 428/457; 523/160; 523/161; 524/45; 524/439; 524/440

(58) Field of Classification Search .......... 106/31.01, 106/31.13, 31.6, 31.65, 31.77, 31.9, 31.92; 347/84, 95, 100, 1, 96; 427/466, 385.5, 372.2; 428/32.1, 457; 523/160, 161; 524/45, 439, 524/440
See application file for complete search history.

(56) References Cited

U.S. PATENT DOCUMENTS

| 5,215,820 A * | 6/1993 | Hosokawa et al. ........ 428/403 |
| 5,429,860 A * | 7/1995 | Held et al. ........... 428/32.3 |
| 5,501,150 A | 3/1996 | Leenders et al. |
| 5,621,449 A | 4/1997 | Leenders et al. |
| 5,858,595 A | 1/1999 | Ziolo |
| 6,025,022 A * | 2/2000 | Matzinger ............... 427/256 |
| 6,274,412 B1 | 8/2001 | Kydd et al. |
| 6,893,490 B2 | 5/2005 | Kawamura et al. |

FOREIGN PATENT DOCUMENTS

| JP | 63-95697 A | 4/1988 |
| JP | 5-171082 A | 7/1993 |
| JP | 7-234550 A | 9/1995 |
| JP | 7-257014 A | 10/1995 |
| JP | 8-188732 A | 7/1996 |
| JP | 8-245914 A | 9/1996 |
| JP | 10-204350 A | 8/1998 |
| JP | 2000182889 A | 6/2000 |
| JP | 2000-256590 A | 9/2000 |
| JP | 2000-313830 A | 11/2000 |
| JP | 2000-318300 A | 11/2000 |
| JP | 2001-192589 A | 7/2001 |
| JP | 2002-121437 A | 4/2002 |
| JP | 2002169489 A1 | 6/2002 |
| WO | WO 0168596 A1 | 9/2001 |
| WO | 01/79361 A1 | 10/2001 |
| WO | WO 0231068 A | 4/2002 |
| WO | 03032084 A2 | 4/2003 |

OTHER PUBLICATIONS

Definition of "carboxymethylcellulose" from Hawley's Condensed Chemical Dictionary, 14th ed., 2002.*
Teng, K. F., *Application of Ink Jet Technology on Photovoltaic Metallization*.1988, 591-593.
Teng, K.F., *A Microprocessor-Controlled Ink Jet Printing System for Electronic Circuits*.1998, 407-412.
Vest, R.W. et al. *Ink Jet Printing of Hybrid Circuits*. 1983, 261-267.
Rivkin, Curtis C. et al. *Proceedings NCPV Program Review Meeting*. 2001, 249-252.
Fuller, S.B. et al. *Ink-Jet Printed Nanoparticle Microelectromechanical Systems*. 2002, 54-60.
Lee, P.C. et al. *Adsorption and Surface-Enhanced Raman of Dyes on Silver and Gold Sols*. 1982, 3391-3395.
Mori, Yasushige, Chemical Engineering Symposium Series, vol. 73, pp. 89-92, 2000.
Han et al., "Preparation of Gold-Polypyrrole Core-Shell Nanoparticles," vol. 371, pp. 127-130, Oct. 2001.

* cited by examiner

*Primary Examiner* — Patrick D Niland
(74) *Attorney, Agent, or Firm* — Lowe Hauptman Ham & Berner LLP (57) ABSTRACT

Compositions for use in ink jet printing onto a substrate comprising a water based dispersion including metallic nanoparticles and appropriate stabilizers. Also disclosed are methods for the production of said compositions and methods for their use in ink jet printing onto suitable substrates.

28 Claims, 5 Drawing Sheets

INK-JET INKS CONTAINING METAL NANOPARTICLES

FIELD OF THE INVENTION

The present invention relates to the field of ink jet inks and ink-jet printing. More specifically, the present invention describes water based ink-jet inks compositions, which contain metal nanoparticles and polymeric additives dispersed within the liquid vehicle comprising mainly water, and methods for the formation of stable, concentrated dispersions of metallic nanoparticles, and inks containing such dispersions. After printing a pattern on a substrate with the use of ink-jet printer, which is either DOD (drop on demand piezo or bubble), or continuous, a layer of the metal nanoparticles is formed. The thickness of the layer can be increased by printing the specific pattern several times, while drying the ink by means such as hot air, in between printing cycles. After the pattern is printed, the substrate with the printed pattern can be transferred into an oven, in which the nanoparticles can be sintered, thus forming a continuous metal pattern, namely, a conductive pattern. The invention also teaches methods to prepare concentrated, stable dispersions of metal particles, and also methods for the stabilization of metallic nanoparticles by various polymers, including conductive polymers. Using the present invention, decorative and conductive patterns can be obtained without the need for sintering at very high temperatures.

BACKGROUND OF THE INVENTION

Metallic nanoparticles are particles having a diameter in the submicron size range, and are either crystalline or amorphous materials. They are composed of pure metal, such as silver, gold, copper etc., or mixture of metals such as alloys, or core of copper covered by a shell of gold or silver.

Currently, nanoscale metal particles draw intense scientific and practical interest due to their unique properties, which differ from those of bulk and atomic species. The unique properties of metal nanoparticles result from their distinct electronic structure and from their the extremely large surface area and high percentage of surface atoms. Metal nanoparticles are characterized by enhanced reactivity of the surface atoms, high electric conductivity, and unique optical properties. Virtually, nanosized materials are well-known materials with novel properties and promising applications in electrochemistry, microelectronics, optical, electronic and magnetic devices and sensors as well as in new types of active and selective catalysts. Creation of stable concentrated nanocolloids of metals with low resistivity may offer new prospects in computer-defined direct-write noncontact technologies, such as ink-jet printing, for deposition of metallic structures on various substrates. Microfabrication of such structures by lithographic technique is a time-consuming and expensive process. Techniques based on expelling small droplets of molten metals onto substrate have met several problems, such as difficulty of adhering droplets onto a substrate, oxidation of the liquid metal, and the difficulty of fabrication a droplet-expulsion mechanism compatible with high temperatures.

Conventional ink-jet inks may contain two types of colored material, dye or pigment, and are characterized by their main liquid, which is the vehicle for the ink. The main liquid may be water (water-based inks), or an organic solvent (solvent-based inks).

The dye or pigment based inks differ with respect to the physical nature of the colored material. Pigment is a colored material that is insoluble in the liquid, while the dye is soluble in the liquid. Each system has drawbacks: pigments tend to aggregate, and therefore clog the nozzles in the orifice plate, or the narrow tubings in the printhead, thus preventing the jetting of the ink while printing. Dyes tend to dry, and form a crust on the orifice plate, thus causing failure in jetting and misdirection of jets.

It is clear that the term "dye" or "pigment" is a general wording for materials, which are soluble or insoluble, respectively, in the solvents comprising the ink. Therefore, metal nanoparticles may be considered, in this context, if introduced into an ink, as pigments of metal, having a size in the nanometer range.

Conventional pigments in ink-jet inks contain particles in the size range of 100-400 nm. In theory, reducing the particle size to 50 nm or less should show improved image quality and improved printhead reliability when compared to inks containing significantly larger particles.

The majority of inks in ink-jet printers are water-based inks. The use of metal nanoparticles as pigments requires the elaboration of ink formulations containing stable concentrated aqueous metal colloid. The synthesis of stable colloidal systems with high metal concentration is a serious problem. A variety of substances have been used to stabilize silver colloids: amphiphilic nonionic polymers and polyelectrolytes, ionic and nonionic surfactants, polyphosphates, nitrilotriacetate, 3-aminopropyltrimethoxysilane, and $CS_2$. Stable water-soluble silver nanoparticles were also obtained by reduction of a silver ions in the presence of amino- and carboxilate-terminated poly(amido amine) dendrimers, and crown ethers. However, the preparations of stable silver colloids, described up to now in the literature, in procedures based on reduction of metal from solution, have low metal concentrations, which amount only to $10^{-5}$-$10^{-2}$ M (about 0.0005-0.1%) even in the presence of stabilizers (it is almost impossible to obtain a stable aqueous silver colloid with the metal concentrations higher then $10^{-3}$ M without an additional stabilizer, due to immediate particle aggregation).

Since ink-jet ink compositions contain, in addition to dyes or pigments, other additives, such as humectants, bactericides and fungicides and binders (polymeric additives, which improve the dye or pigment binding to substrate), the stabilizers should be compatible with these substances and should not change noticeably the physicochemical and rheological characteristics of inks (the most important characteristics are viscosity and surface tension).

Several methods of the metallic image generation with the use of ink-jet technology have been described.

One known method is based on an ink containing a reducing agent and receiving material containing the reducible silver compound ($AgNO_3$ or silver di(2-ethylhexyl)-sulphosuccinate), and, on the contrary, an ink and a receiving support containing a silver compound and reducer, respectively. Heating the receiving support during or after the ink deposition resulted in an image formed by silver metal (U.S. Pat. No. 5,501,150 to Leenders, et al; U.S. Pat. No. 5,621,449 to Leenders, et al).

Another approach for the deposition of metal structures is based on ink-jet printing of organometallic precursors dissolved in organic solvent with subsequent conversion of the precursor to metal at elevated temperatures (~300° C.). To increase the metal (silver) loading of ink and to obtain higher decomposition rates, silver or other metal nanoparticles may be added to the ink along with the organometallic precursor. Near-bulk conductivity of printed silver films has been achieved with such compositions (Vest, R. W.; Tweedell, E. P.; Buchanan, R. C. *Int. J. Hybrid Microelectron.* 1983, 6, 261; Teng, K. F.; Vest, R. W. *IEEE Trans. Indust. Electron.*

1988, 35, 407; Teng, K. F.; Vest, R. W. *IEEE Electron. Device Lett.* 1988, 9, 591, Curtis, C.; Rivkin, T.; Miedaner, A.; Alleman, J.; Perkins, J.; Smith, L.; Ginley, D. *Proc. of the NCPV Program Review Meeting.* Lakewood, Colo., USA, Oct. 14-17, 2001, p. 249).

Fuller et al. demonstrated ink-jet printing with the use of colloidal inks containing 5-7 nm particles of gold and silver in an organic solvent, α-terpineol, in order to build electrically and mechanically functional metallic structures. When sintered at 300° C., the resistivity of printed silver structures was found to be 3 μΩ·cm, about twice of that for bulk silver (Fuller, S. B.; Wilhelm, E. J.; Jacobson, J. M. *J. Microelectromech. Syst.* 2002, 11, 54).

SUMMARY OF THE INVENTION

The present invention provides compositions and methods for the preparation of water-based ink-jet inks, in which the pigments are nanoparticles of metal, and composition and methods for preparing stable, concentrated metallic nanoparticles dispersions. The ink composition of the present invention overcomes a common problem in pigment containing ink-jet inks, namely sedimentation, since the particle size is very small, below 100 nanometers, preferably in the range 20-60 nanometers, thus the sedimentation rate is very slow, and is hindered by the Brownian motion. Another aspect of the invention is that the stable dispersions of nanoparticles are prepared in the presence of suitable polymeric stabilizers, which prevent the particles from growing during the aggregation process, even if the nanoparticles are present at a high concentration in the liquid. The stabilizer is a water-soluble polymer or a surfactant, or a combination of the two. It was found that the best stabilizer is carboxymethyl cellulose sodium salt (CMC), low or medium viscosity grade. It was found that the CMC can also function as the binder in the ink-jet ink formulations, namely, as the component which provides the adhesion of the ink droplets onto the substrate, while the substrate can be made of various materials, such as plastics, paper, glass, etc. . . . CMC also allows for the modification of the viscosity of the ink for the viscosity range required for the ink-jet printing.

In another aspect of the invention, we found, surprisingly, that a conductive polymer, polypyrrole (PP), can be used as the stabilizing polymer, thus forming new, and previously unknown, metallic dispersions and inks. The use of π-electron conjugated polymers, in addition to their stabilizing and adhesive effects, is determined by their electric conductivity. Such polymers can serve as binder, providing for the formation of continuous electroconducting layers on the substrate surface after ink-jet printing.

In a different embodiment of the invention, in order to increase the conductivity of printed circuits without sintering at elevated temperature we also used a new approach, based on flocculation of the metallic particles, after printing. Using this approach, first the metallic dispersion is printed, followed by printing a second layer of aqueous solution of a flocculant. The flocculant causes aggregation of the metallic nanoparticles, after they have been printed, thus bringing them into close contact, and improving the possibility for obtaining electrical conductivity. We describe here the use of two flocculants, representing two classes of flocculation agents, but the process may be obtained with a large variety of flocculants. The flocculants used are either an electrolyte having high valency ions, or polymer whicj is has electrical charge opposite to that of the metallic nanoparticles, such as: aluminum sulfate, poly(diallyldimethylammonium chloride (PDAC) or a charged, water soluble conductive polymer.

Addition of $Al_2(SO_4)_3$ induces the compression of the electrical double layer around colloidal particles that leads to overcoming the energy barrier caused by repulsive forces. As a result, attractive Van der Waals forces pull the nanoparticles into contact following aggregation. It is generally accepted that polymeric flocculants act by adsorption and "bridging", resulting in the formation of tough flocs of colloidal particles, such that a low-temperature "sintering"-like process takes place. Obviously, if the bridging polymer is conductive by itself, a better electrically conductive layer can be obtained.

The present invention focuses mainly on the formation and printing of silver nanoparticles by ink jet printers, but may include, as clear for those skilled in the art of nanoparticles, nanoparticles of metals other then silver, such as gold, copper, etc. . . . . In addition, it is clear that the metallic patterns can be used for decoration purposes, even if the resulting pattern is not electrically conductive. Another aspect of the invention is that the resulting pattern of the silver nanoparticles has an antimicrobial effect, due to the presence of silver nanoparticles, thus eliminating the need for antimicrobial agents which are often introduced into water based ink jet inks.

It should be mentioned that the nanoparticles, due to their very small size, will behave differently, when compared to large particles. For example, nanoparticles have a lower melting point than bulk metal, and a lower sintering temperature than that of bulk metal. This property is of particular importance when sintering is needed in order to obtain electrical conductivity.

Prior art search did not show any report on formation of water-based ink-jet ink, which contain silver nanoparticles. The only attempt to make a silver printed layer by direct ink-jet printing, as has been already mentioned, was performed with the use of gold and silver nanoparticles dispersed in a solvent, α-terpineol (Fuller, S. B.; Wilhelm, E. J.; Jacobson, J. M. *J. Microelectromech. Syst.* 2002, 11, 54). The benefits of using water based inks over solvent based inks are clear, to those familiar with the field of printing. Furthermore, there are no reports on the formation of stable, concentrated dispersions of metallic nanoparticles, and there are no reports on the formation and stabilization of metallic nanoparticles in presnce of conductive polymers.

The present invention relates to an ink jet composition for use in ink jet printing onto a substrate comprising a water-based dispersion comprised of metal nanoparticles and at least one stabilizer.

According to preferred embodiments of the present invention, the metal nanoparticles have a particle size below 100 nanometers. Preferably, the metal particles have a particle size between 20-60 nanometers.

Further according to preferred embodiments of the present invention, the water-based dispersion further comprises at least one of the group consisting of humectants, antimicrobial agents, surfactants, fungicides, and rheology modifiers.

Additionally according to preferred embodiments of the present invention, the stabilizer comprises a surfactant.

Still further according to preferred embodiments of the present invention, the stabilizer comprises a water-soluble polymer.

Moreover according to preferred embodiments of the present invention, the polymer is carboxymethyl cellulose sodium salt.

Further according to preferred embodiments of the present invention, the polymer is a conductive polymer.

Additionally according to preferred embodiments of the present invention, the polymer is polypyrrole.

Still further according to preferred embodiments of the present invention, the metal nanoparticles are of metal having high electric conductivity. The metal nanoparticles may be, for example, silver, gold, or copper nanoparticles.

Moreover according to preferred embodiments of the present invention, the composition comprises at least one wetting agent. Preferably, the wetting agent is selected from one or more of group consisting of BYK-154, BYK-348, Disperbyl-181, Disperbyk-184 and LABS.

Further according to preferred embodiments of the present invention, the substrate is glass, PVC, or paper. Other appropriate substrates could also be used.

The present invention also relates to method for obtaining a metallic decorative pattern, comprising ink jet printing the ink jet composition as described above onto a suitable substrate.

The present invention also relates to a method for obtaining a conductive pattern, comprising ink jet printing the ink jet composition as described above onto a suitable substrate.

Further according to preferred embodiments of the present invention, the method for obtaining a decorative or a conductive pattern also comprises repeating ink jet printing any number of times to form additional conductive layers on the substrate.

Additionally according to preferred embodiments of the present invention, the method further comprises printing a flocculant solution onto the substrate.

Still further according to preferred embodiments of the present invention, the method further comprises drying the substrate.

Moreover according to preferred embodiments of the present invention, the method further comprises heating the substrate in an oven to allow sintering.

Further according to preferred embodiments of the present invention, the method also comprises dipping at least a portion of the substrate into an electroless bath.

The present invention also relates to a method for ink jet printing onto a substrate comprising printing an ink containing a water based dispersion comprising metal nanoparticles and at least one stabilizer onto a substrate and printing a liquid containing a flocculant onto said substrate on top of said ink containing said water based dispersion.

According to preferred embodiments of the present invention, the flocculant comprises a conductive polymer. Preferably, the flocculant comprises aluminum sulfate. Alternatively, the flocculant comprises poly (diallyldimethylammonium chloride).

Further according to preferred embodiments of the present invention, the flocculant is in a solution in an amount of 0.01%.

The present invention also relates to a method for ink jet printing onto a substrate using an ink jet comprising printing an ink containing at least one flocculant onto a substrate, and printing an ink containing a water based dispersion comprising metal nanoparticles and at least one stabilizer onto said substrate on top of said ink containing said flocculant.

According to preferred embodiments of the present invention, the flocculant comprises a conductive polymer. Preferably, the flocculant comprises aluminum sulfate. Alternatively, the flocculant comprises poly (diallyldimethylammonium chloride).

Further according to preferred embodiments of the present invention, the flocculant is in a solution in an amount of 0.01%.

The present invention also relates to a method for the preparation of an ink jet composition for use in ink jet printing onto a substrate, said ink jet composition comprising a water based dispersion comprised of metal nanoparticles and at least one stabilizer, comprising reducing a metal salt in the presence of an appropriate reducing agent and a water-soluble polymer to obtain a metal colloid.

According to preferred embodiments of the present invention, the polymer is carboxymethyl cellulose sodium salt. Preferably, the carboxymethyl cellulose sodium salt is at a concentration of 0.2% by weight.

Further according to preferred embodiments of the present invention, the polymer is a conductive polymer. Preferably, the polymer is polypyrrole. More preferably, the polypyrrole is at a concentration of 0.03% by weight.

Still further according to preferred embodiments of the present invention, the metal nanoparticles are silver nanoparticles.

Additionally according to preferred embodiments of the present invention, the reducing agent is selected from the group consisting of sodium borohydride, trisodium citrate, hydrazine, ascorbic acid, ribose, and gaseous hydrogen. Other suitable reducing agents may be used, depending on the type of metal nanoparticles that are used.

Moreover according to preferred embodiments of the present invention, the method also comprises removing water so as to obtain highly concentrated metal nanoparticles. Preferably, said removing of water is accomplished through a method selected from the group consisting of lyophilization, treating in a vacuum oven, evaporating, and spray drying. Other suitable method may also be employed.

The present invention also relates to a composition comprising a water based dispersion of metal nanoparticles and at least one water soluble polymer.

According to preferred embodiments of the present invention, the metal nanoparticles have a particle size below 100 nanometers. Preferably, the metal particles have a particle size between 20-60 nanometers.

Further according to preferred embodiments of the present invention, the metal nanoparticles are silver nanoparticles.

Additionally according to preferred embodiments of the present invention, the polymer is carboxymethyl cellulose sodium salt.

Still further according to preferred embodiments of the present invention, the water soluble polymer is a conductive polymer. Preferably, the polymer is polypyrrole.

The present invention also relates to a method for obtaining a film having high electromagnetic radiation absorption capability, comprising printing or coating a water based dispersion of metal nanoparticles and at least one water soluble polymer onto a substrate. The film is useful for absorbing electromagnetic radiation such as that produced by radar for determining the location of airplanes, or for other applications as well.

DETAILED DESCRIPTION OF THE INVENTION

1. Preparation of Silver Nanoparticles

Fine metal particles from micrometer to nanometer size can be synthesized by both physical methods (formation in gas phase, laser ablation) and chemical methods (sonochemical or photochemical reduction, electrochemical synthesis, chemical reduction), as are known in the art. The former methods provide fine metal particles by decreasing the size by applying energy to the bulk metal, while in the latter methods, fine particles are produced by increasing the size from metal atoms obtained by reduction of metal ions in solution.

In the present invention, the chemical method for the preparation of silver nanoparticles is preferably employed, namely, fine particles were produced by a proper silver nitrate reduction in aqueous solution with the use of a proper reducing agent according to the following scheme:

$$Me^{n+} + nRed \longrightarrow Me^o + nOx$$

Silver nanoparticles can be prepared with the use of various reducing agents, such as sodium borohydride, trisodium citrate, hydrazine, ascorbic acid, ribose and gaseous hydrogen.

A number of samples with different concentrations were prepared.

Silver colloids with nanosized particles were prepared by reduction of $AgNO_3$ by trisodium citrate at various concentrations of reagents according to the procedure described by Lee and Meisel (Lee, P. C.; Meisel, D. *J. Phys. Chem.* 1982, 86, 3391.) (the $AgNO_3$:citrate molar ratio was kept constant and equal to 1.56).

1.1. Preparation without a Polymer

Figure 1:
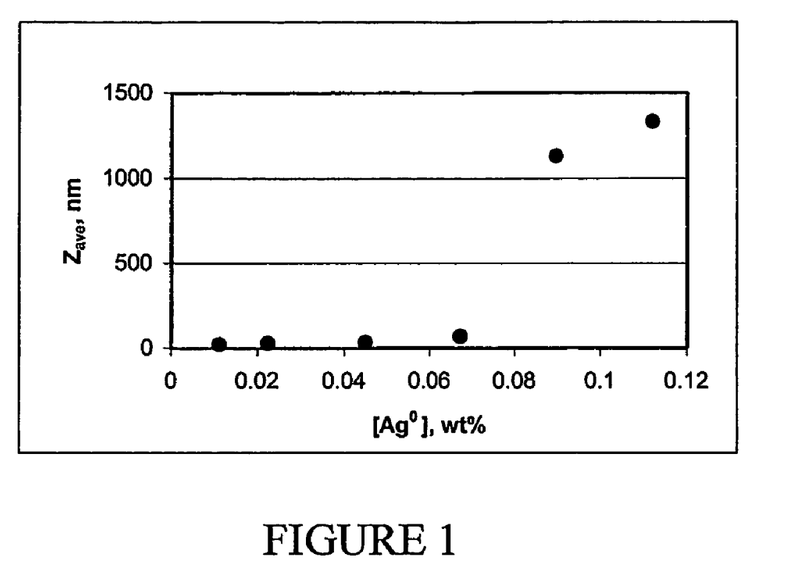
FIG. 1 is a graph illustrating the effect of increasing $Ag^0$ concentration on colloidal silver particle size prepared in the absence of a stabilizer. Measurements were carried out one hour after preparation with the use of Dynamic Light Scattering.

Solution of trisodium citrate dihydrate (1-10 wt % in 2 ml of double distilled water) was added dropwise to a hot (94-95° C.) solution of silver nitrate (18-180 mg in 100 ml of double distilled water), while stirring. The reaction mixture was kept hot for 10 minutes and then cooled at room temperature. The resulting colloid had a yellow-brownish color and has nanosized particles, as seen from FIG. 1, only at silver concentrations lower than ~0.07 wt % (~6.7·10-3 M). At higher $Ag^0$ concentrations, which are the aim of this invention, the average particle size increases rapidly and is followed by precipitation of microparticulate silver within a few hours. Obviously, such preparation is not suitable for use as a component in an ink jet ink.

1.2. Preparation of Polymer-Stabilized Nanoparticles

Two milliliters of trisodium citrate solution (1-10%) in aqueous CMC or PP (0.025-0.2%) was added dropwise to heated (94-95° C.) solution of $AgNO_3$ (18-180 mg in 100 ml of aqueous CMC (carboxy methyl cellulose sodium) or PP (polypyrrole) with concentration 0.025-0.2%), while stirring. The reaction mixture was kept hot for 10 min, and then cooled at room temperature. The resulting CMC-stabilized colloid had a brownish color, and PP-stabilized colloid had blue-black color (black color is observed by the color of PP solution).

Figure 2:
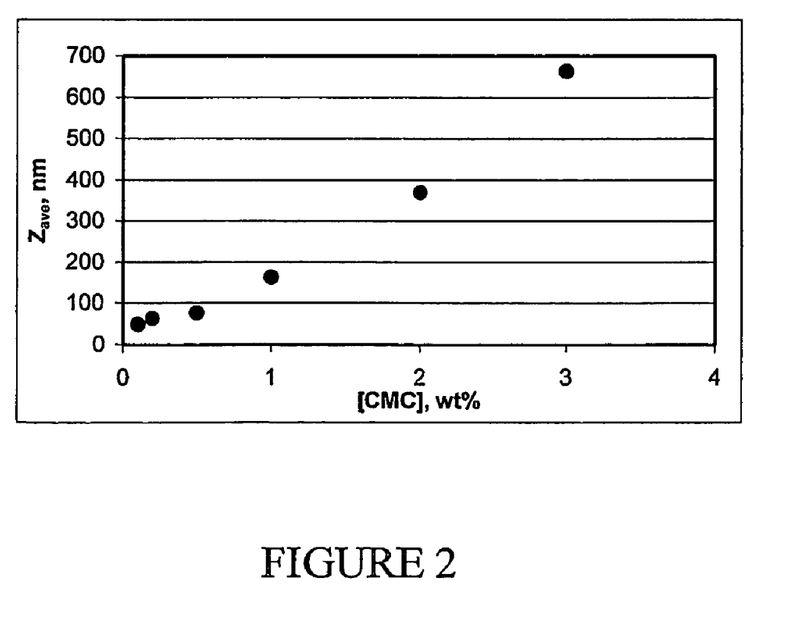
FIG. 2 is a graph illustrating the average particle size of colloidal silver as a function of CMC concentration. Measurements were carried out with the use of Dynamic Light Scattering.
Figure 3:
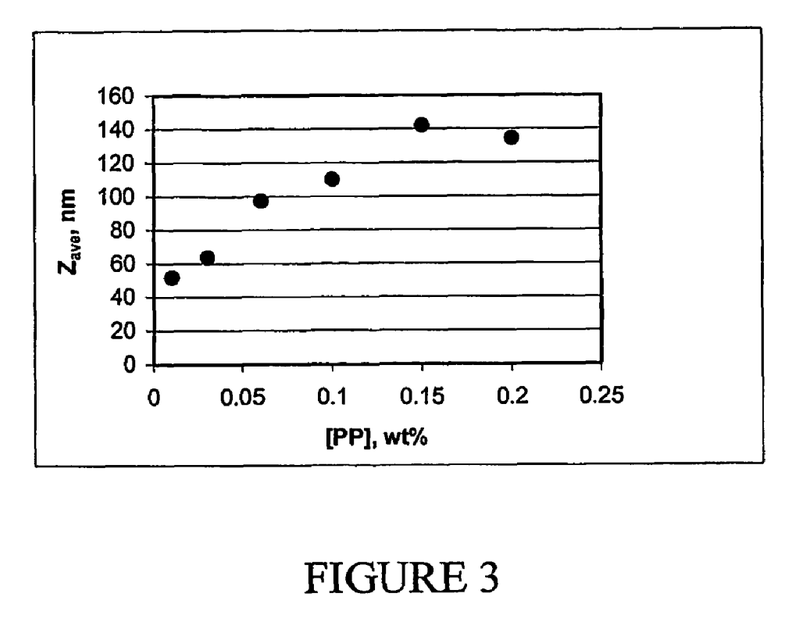
FIG. 3 is a graph illustrating the average particle size of colloidal silver as a function of PP concentration. Measurements were carried out with the use of Dynamic Light Scattering.

As seen from FIGS. 2 and 3, an increase in polymer concentration results in increase in the average particle size ($Z_{ave}$). The optimal concentrations of CMC and PP, which allow obtaining stable $Ag^0$ nanocolloids with average particle size ($Z_{ave}$) up to 100 nm, was found to be 0.2% and 0.03%, respectively.

2. Stability of Polymer-Stabilized $Ag^0$ Nanoparticles

The stability of the $Ag^0$ nanoparticles prepared in the presence of stabilizers was evaluated by the changes in the average particle's size with time.

Figure 4:
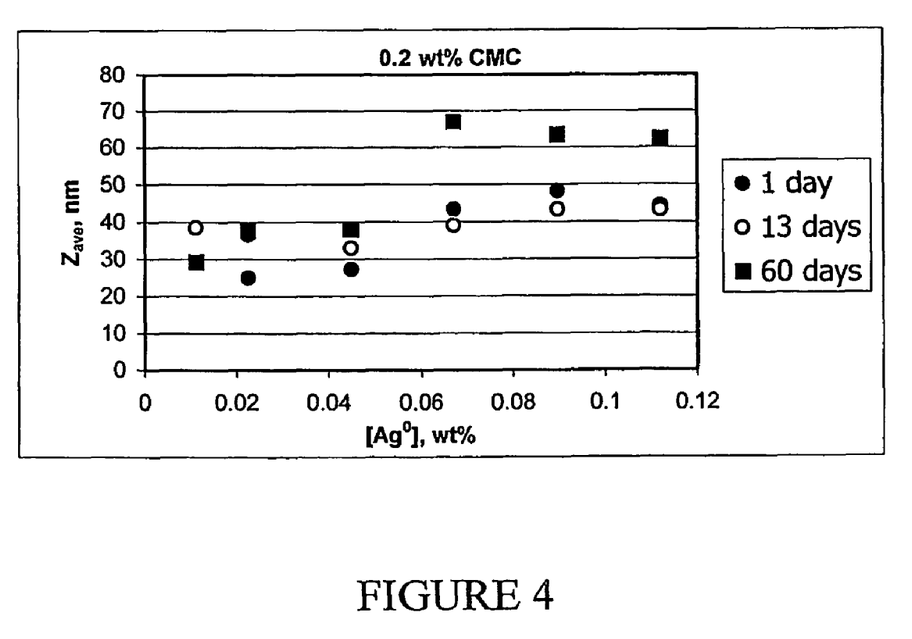
FIG. 4 is a graph illustrating the average size of CMC-stabilized $Ag^0$ nanoparticles as a function of $Ag^0$ concentration and time (by Dynamic Light Scattering).
Figure 5:
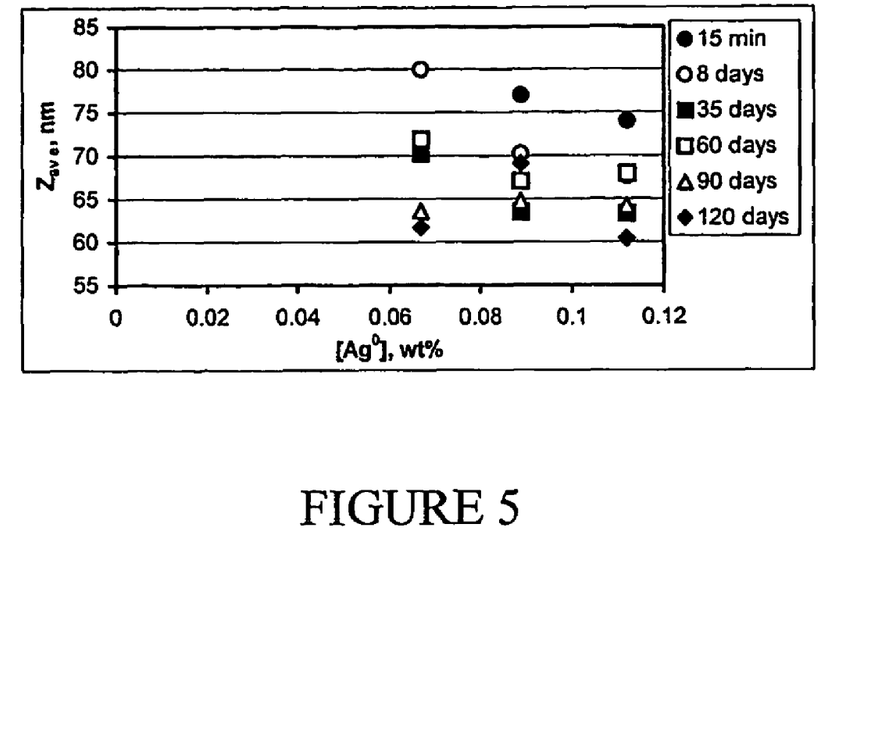
FIG. 5 is a graph illustrating the average size of polypyrrole (PP)-stabilized $Ag^0$ nanoparticles as a function of $Ag^0$ concentration and time (by Dynamic Light Scattering). [PP]=0.03 wt %.

As seen from FIG. 4, the silver nanocolloid prepared in the presence of 0.2 wt % CMC is stable at least 2 months, as indicated by the relative constancy of the average particle size (25-60 nm). PP-stabilized $Ag^0$ nanoparticles (FIG. 5) are stable in the presence of 0.03 wt % of this conductive polymer for at least 4 month (Zave in the range of 60-80 nm). It was found that films of PP-stabilized Ag nanoparticles (0.3-1% of Ag and 0.3-1% of PP), which were deposited onto glass and let dry, display electrical conductivity of 0.13-0.17 S/m.

3. Preparation of Highly Concentrated Silver Nanocolloids

Highly concentrated silver nanocolloids were prepared by partial or total removal of the water present in the dispersion of polymer-stabilized nanocolloids (by means of lyophilization, spray drying etc. . . . ), followed by redispersion in a proper (smaller volume) amount of water.

3.1. Preparation by Partial Lyophilization

Figure 6:
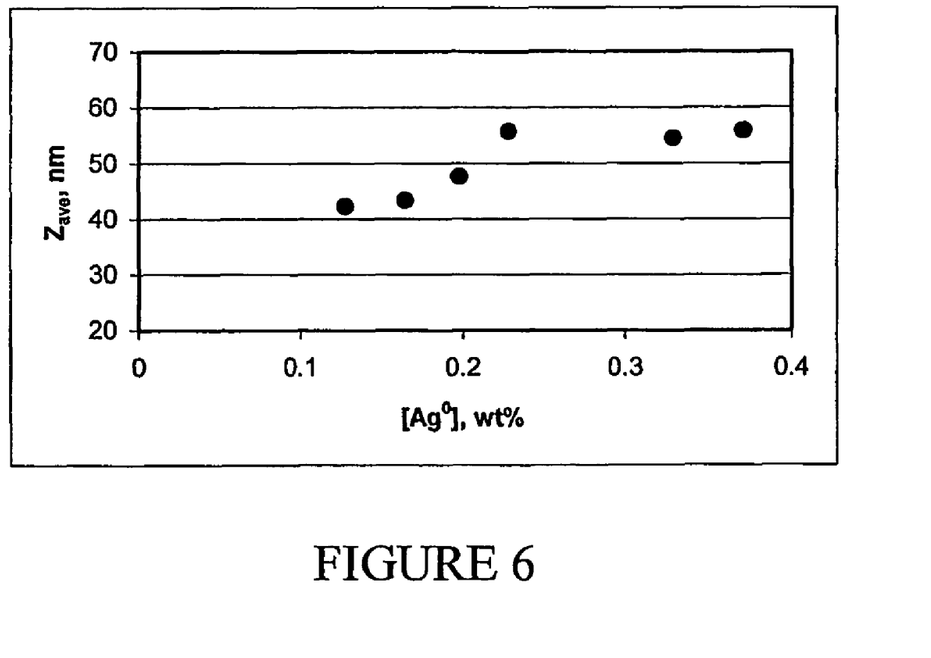
FIG. 6 is a graph illustrating the average particle size as a function of $Ag^0$ concentration in lyophilizing nanocolloid ([CMC]=0.1 wt %) by Dynamic Light Scattering.

FIG. 6 presents $Z_{ave}$ of colloidal particles as a function of increasing $Ag^0$ concentration during lyophilization. The maximum concentration in FIG. 6, 0.37 wt %, corresponds to $3·10^{-2}$ M. The $Z_{ave}$ values are in the range of 50-60 nm.

3.2. Preparation by Exhausted Lyophilization and Redispersion

Figure 7:
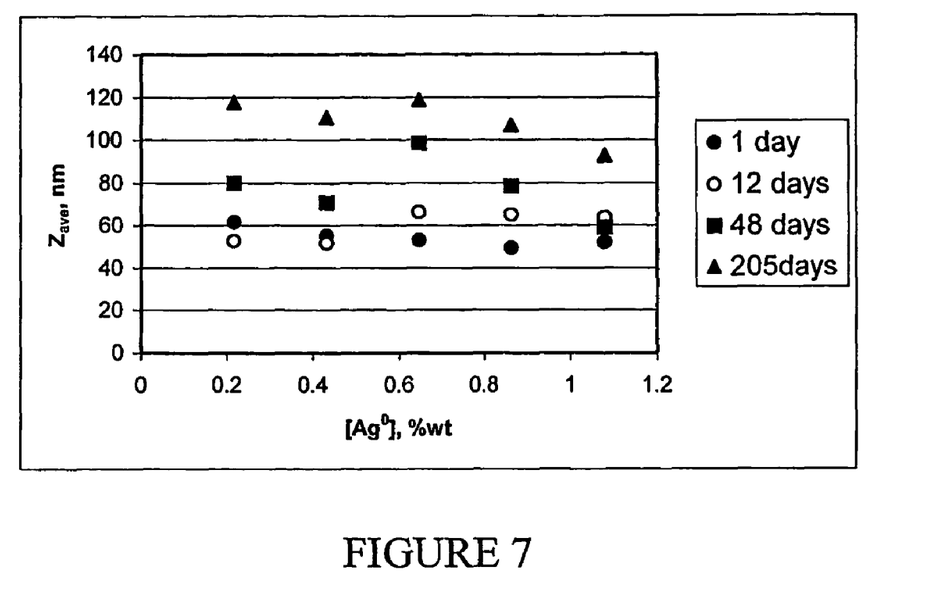
FIG. 7 is a graph illustrating the average size of redispersed $Ag^0$ nanoparticles as a function of $Ag^0$ concentration and time (by Dynamic Light Scattering).

The $Ag^0$ powder obtained after exhausted lyophilization of polymer-stabilized nanocolloid was redispersed in a proper amount of water. As seen from FIG. 7, the average size of redispersed particles is in the range of 50-60 nm one day after preparation and increases only up to about 100 mm 205 days (~7 months) after preparation. Thus, the water-based $Ag^0$ nanocolloids with very high concentration (compared to reported concentrations) of 1.1 wt % (~0.1 M) display excellent long-term stability, while being non viscous (viscosity below 8 cps) and can be used in ink-jet ink formulations. Also clear is that the final concentration of the particles can be even much higher, up to about 60-74% by volume, limited only by the viscosity of the final dispersion, yielding liquids having low viscosity, or pastes. The use as ink jet ink will be limited to a specific viscosity range required for jetting, depending on the printhead type and temperature of jetting. Obviously, such metallic dispersions (or dried powder) can be used in applications other then ink jet printing.

4. Nanoparticles Flocculation

In order to study the "non-thermal sintering" of $Ag^0$ nanoparticles by flocculants, one milliliter of $Al_2(SO_4)_3$ or PDAC solutions with different concentrations were added to 1 ml of $Ag^0$ nanocolloid, and the concentrations inducing formation of $Ag^0$ precipitate (Critical Coagulation Concentration, or "CCC") were evaluated. It has been found that at any concentration of $Ag^0$ in nanocolloid, CCC strongly depends on the concentration of polymeric stabilized. This is obvious from the bar diagram in FIG. 8 for the nanocolloid with $Ag^0$ concentration of 0.1 wt %.

Figure 8:
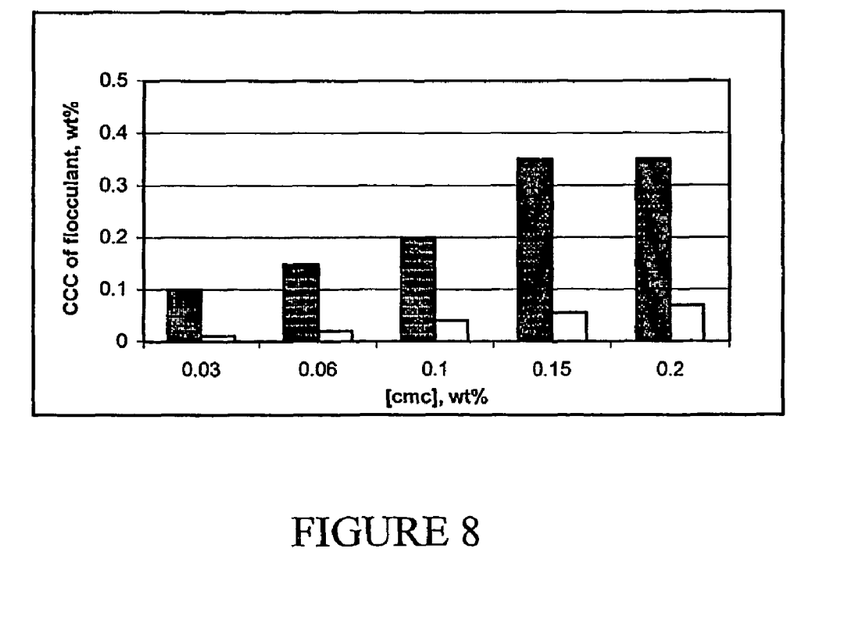
FIG. 8 is a chart illustrating CCC of a flocculant (black bars represent Al2(SO4)3; open bars represent PDAC) as a function of polymeric stabilizer (CMC) concentration for a colloid with $[Ag^0]$=0.1 wt %.

Because of bridging effect of PDAC, its CCC is noticeably lower compared to $Al_2(SO_4)_3$. It is clear that the flocculated metall nanoparticles can be achieved by printing by ink jet two layers: first printing the metallic ink, followed by printing, on the same pattern, the solution of the flocculant ("flocculation ink"), or vise versa. In addition, the printing can be performed on a substrate which was pre-treated with the flocculant, at appropriate concentrations, thus yielding fixation and flocculation of the metal particles in the printed pattern. It should be noted that the pattern may be printed on various types of substrates, such as paper, plastics and polymeric compositions, glass etc.

5. Preparation of Ink Jet Inks Containing Silver Nanoparticles

The suitability of formulations for printing was evaluated with the use of Epson Stylus-460 ink-jet printer, which requires very low viscosity inks, below 10 cps. Several ink jet formulations are described in the following examples. Obviously, the additives such as wetting agents, humectants, can be selected from a wide range of possibilities. Each formulation was capable of printing, even after prolonged time.

Example 1

| | |
|---|---|
| Silver nanoparticles (0.18%) in 0.2% CMC solution | 99.75%, w/w |
| BYK-154 | 0.25%, w/w |

Example 2

| | |
|---|---|
| Silver nanoparticles (0.18%) in 0.2% CMC solution | 94.95%, w/w |
| BYK-348 | 0.1%, w/w |
| DPnB (dipropyleneglycol butyl ether) | 5%, w/w |

Example 3

| | |
|---|---|
| Silver nanoparticles (1.44%) in 0.1% CMC of solution | 98.9%, w/w |
| Disperbyk-181 | 0.1%, w/w |
| Disperbyk-184 | 1.00%, w/w |

Example 4

| | |
|---|---|
| Polypyrrol solution (1%) | 98.9%, w/w |
| Disperbyk-184 | 1%, w/w |
| Disperbyk-181 | 0.1%, w/w |

Example 5

| | |
|---|---|
| Silver nanoparticles (0.112%) in 0.03% of PP solution | 98.9%, w/w |
| Disperbyk-184 | 1%, w/w |
| Disperbyk-181 | 0.1%, w/w |

Example 6

This example presents the possibility to print the metallic pattern, followed by printing of a flocculating agent on said metallic pattern, in order to obtain close contact of the metallic particles, due to the flocculation.

Step 1. Printing the ink containing 0.112% dispersion of silver nanoparticles stabilized by 0.03% CMC (98.9%, w/w), Disperbyk 184 (1%, w/w) and Disperbyk 181 (0.1%, w/w) onto proper support.

Step 2. Printing the 0.01% PDAC solution (99.23%, w/w) containing Disperbyk 184 (0.7%, w/w) and Disperbyk 181 (0.07%, w/w) onto the image printed in Step 1.

Printing was performed on various substrates, such as paper, transparency, glass and PVC. In general, the suitable surface tension could be achieved by selecting a proper surfactant or co-solvent, and the proper viscosity could be achieved by adjusting the concentration of the CMC.

In general, the new ink jet ink contains the silver nanoparticles, and aqueous solution which may contain surfactants, additional polymers, humectants, cosolvents, buffering agent, antimicrobial agent and defoamers in order to ensure proper jetting and adhesion of the ink to specific substrates.

The conductive pattern can be achieved either by the direct printing repeated for several times, with or without heating and drying cycles, or/and by using the first metal pattern to induce formation of additional metal layers, such as encountered in "electroless process". For example, the printing may be followed by additional dipping in electroless bath, or by printing the electroless solution onto the printed pattern. Actually, the printed nanoparticles can be used as templates for further crystallization and precipitation of other materials.

Figure 9:
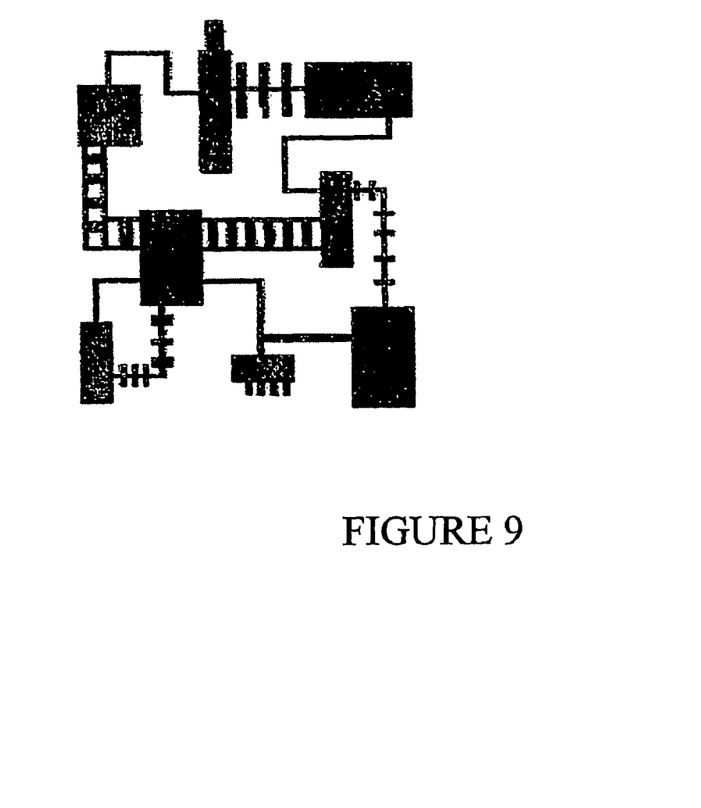
FIG. 9 is a printed image formed with the use of Ag-containing ink-jet ink (Formulation 3) on inkjet transparency.
Figure 10:
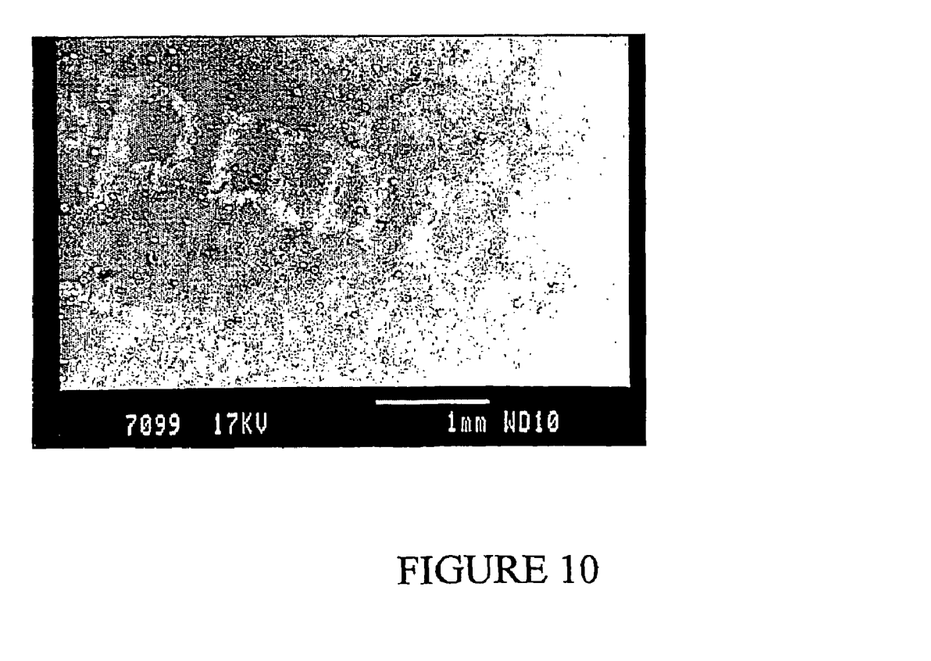
FIG. 10 is a SEM (Scanning Electron Microscopy) image of printed Ag-containing formulation on ink-jet transparency.

FIG. 9 represents an example of printed image formed with the use of Ag-containing ink-jet ink on ink-jet transparency. FIG. 10 represents SEM (Scanning Electron Microscopy) image of printed Ag-containing formulation on the same substrate.

The invention claimed is:

1. A method for obtaining a metallic decorative pattern, comprising ink jet printing an inkjet composition comprising a water-based dispersion comprising metal nanoparticles and at least one water soluble polymer onto a substrate to form a pattern and dipping at least a portion of the pattern into an electroless bath.

2. A method for obtaining a conductive pattern, comprising ink jet printing an ink jet composition comprising a water-based dispersion comprising metal nanoparticles and at least one water soluble polymer onto a substrate to form a pattern and dipping at least a portion of the pattern into an electroless bath.

3. A method according to claim 1 or 2 wherein the substrate is glass.

4. A method according to claim 1 or 2 wherein the substrate is PVC.

5. A method according to claim 1 or 2 wherein the substrate is paper.

6. A method for obtaining a metallic pattern selected from the group consisting of a decorative pattern and a conductive pattern, comprising ink jet printing a water-based dispersion comprising metal nanoparticles and at least one water soluble polymer onto a substrate and printing a flocculant solution onto said substrate.

7. A method for obtaining a metallic pattern selected from the group consisting of a decorative pattern and a conductive pattern, comprising ink jet printing a water-based dispersion comprising metal nanoparticles and at least one water soluble polymer to produce a pattern onto a substrate and sintering said pattern.

8. A method for ink jet printing onto a substrate comprising printing an ink containing a water based dispersion comprising metal nanoparticles and at least one water soluble polymer onto a substrate and printing a liquid containing a flocculant onto said substrate on top of said ink containing said water based dispersion.

9. A method according to claim 8, wherein the flocculant comprising a conductive polymer.

10. A method according to claim 8, wherein the flocculant comprises aluminium sulfate.

11. A method according to claim 8, wherein the flocculant comprises poly(diallyldimethylammonium chloride).

12. A method for ink jet printing onto a substrate comprising printing an ink containing at least one flocculant onto a substrate, and printing an ink containing a water based dispersion comprising metal nanoparticles and at least one water soluble polymer onto said substrate on top of said ink containing said flocculant.

13. A method according to claim 12, wherein the flocculant comprises aluminum sulfate.

14. A method according to claim 12, wherein the flocculant comprises poly(diallyldimethylammonium chloride).

15. A method according to claim 12, wherein the flocculant is in a solution in an amount of 0.01%.

16. A method for the preparation of an ink jet composition for use in ink jet printing onto a substrate, said ink jet composition comprising a water based dispersion comprised of metal nanoparticles and at least one water soluble polymer, comprising reducing a metal salt in the presence of an appropriate reducing agent and a water-soluble polymer to obtain a metal colloid,
wherein the reducing agent is selected from the group consisting of sodium borohydride, trisodium citrate, hydrazine, ascorbic acid, ribose, and gaseous hydrogen.

17. A method for the preparation of an ink jet composition for use in ink jet printing onto a substrate, said ink jet composition comprising a water based dispersion comprised of metal nanoparticles and at least one water soluble polymer, comprising reducing a metal salt in the presence of an appropriate reducing agent and a water-soluble polymer to obtain a metal colloid,
wherein the polymer is carboxymethyl cellulose sodium salt.

18. A method according to claim 17, wherein the carboxymethyl cellulose sodium salt is at a concentration of 0.2% by weight.

19. A method according to claim 16, wherein the polymer is a conductive polymer.

20. A method according to claim 19, wherein the polymer is polypyrrole.

21. A method according to claim 20, wherein the polypyrrole is at a concentration of 0.03% by weight.

22. A method according to claim 16, wherein the metal nanoparticles are silver nanoparticles.

23. A method according to claim 16, further comprising removing water so as to obtain highly concentrated metal nanoparticles.

24. A method according to claim 23, wherein removing of water is accomplished through a method selected from the group consisting of lyophilization, treating in a vacuum oven, evaporating, and spray drying.

25. A method for reducing electromagnetic reflection from a substrate, the method comprising:
applying a film comprising a water-based colloidal dispersion of metal nanoparticles formed by reduction of a metal salt and at least one water soluble polymer onto a substrate and sintering said film.

26. A method according to claim 25 applied to at least a portion of an aircraft.

27. A method for ink jet printing comprising:
(a) providing a flocculant upon at least a portion of a substrate; and
(b) printing an ink containing a water based dispersion comprising metal nanoparticles and at least one water soluble polymer onto at least a portion of said portion of said substrate.

28. A method according to any of claims 1, 2 or 27 wherein the substrate is a plastic.

* * * * *